(12) United States Patent
Chandrahalim et al.

(10) Patent No.: US 8,390,398 B2
(45) Date of Patent: Mar. 5, 2013

(54) DIGITALLY PROGRAMMABLE RF MEMS FILTERS WITH MECHANICALLY COUPLED RESONATORS

(75) Inventors: Hengky Chandrahalim, Ithaca, NY (US); Sunil Ashok Bhave, Ithaca, NY (US)

(73) Assignee: Cornell Center for Technology, Enterprise and Commercialization, Ithaca, NY (US)

( * ) Notice: Subject to any disclaimer, the term of this patent is extended or adjusted under 35 U.S.C. 154(b) by 608 days.

(21) Appl. No.: 12/608,290

(22) Filed: Oct. 29, 2009

(65) Prior Publication Data

US 2010/0171570 A1 Jul. 8, 2010

Related U.S. Application Data

(60) Provisional application No. 61/109,341, filed on Oct. 29, 2008.

(51) Int. Cl.
*H03H 9/46* (2006.01)
(52) U.S. Cl. .................... 333/186; 333/197; 333/199
(58) Field of Classification Search .................. 333/186, 333/189, 197, 199; 310/323, 328, 331
See application file for complete search history.

(56) References Cited

U.S. PATENT DOCUMENTS

| | | | |
|---|---|---|---|
| 6,374,677 B1 * | 4/2002 | Berlin et al. ............ | 73/662 |
| 6,930,569 B2 * | 8/2005 | Hsu ..................... | 333/186 |
| 7,295,088 B2 * | 11/2007 | Nguyen et al. .......... | 333/186 |
| 7,348,867 B2 * | 3/2008 | Hattori ................. | 333/186 |
| 7,911,296 B2 * | 3/2011 | Nguyen et al. .......... | 333/186 |
| 7,965,156 B2 * | 6/2011 | Ward et al. ............. | 333/186 |
| 2010/0109810 A1 * | 5/2010 | Hashimura ............. | 333/197 |

FOREIGN PATENT DOCUMENTS

| | | | |
|---|---|---|---|
| WO | WO 2007/037150 | * | 4/2007 |
| WO | WO 2008/019179 | * | 2/2008 |

OTHER PUBLICATIONS

Clark et al.; "Parallel-Coupled Square-Resonator Micromechanical Filter Arrays"; 2006 International Frequency Control Symposium and Exposition, Jun. 2006, pp. 485-490 and one page IEEE Xplore abstract page.*
Li et al.; "An MSI Micromenchaical Differential Disk-Array Filter"; Transduces and Eurosensors '07, The 14th International Conference on Solid-State Sensors, Actuators and Microsystems, Lyon, France Jun. 10-14, 2007, pp. 307-311.*
Lee et al.; "Mechanically-Coupled Micromechanical Resonator Arrays for Improved Phase Noise"; 2004 IEEE International Ultrasonics, Ferroelectrics, and Frequency Control Joint 50th Anniversary Conference, Aug. 23-27, 2004, pp. 144-150 and one page IEEE Xplore abstract page.*

(Continued)

*Primary Examiner* — Barbara Summons
(74) *Attorney, Agent, or Firm* — Heslin Rothenberg Farley & Mesiti P.C.

(57) ABSTRACT

A digitally-tunable RF MEMS filter includes a substrate and a plurality of mechanically coupled resonators, wherein a first and a last resonator of the plurality of mechanically coupled resonators are configured to be electrostatically transduced. One or more of the plurality of mechanically coupled resonators are configured to be biased relative to the substrate such that the one or more biased resonators may be brought substantially in contact with the substrate. In a method of digitally tuning an RF MEMS filter having a mechanically coupled resonator array, a DC bias voltage is applied to at least a first resonator and a last resonator of the mechanically coupled resonator array such that motional boundary conditions for the at least first resonator and last resonator are selectable in proportion to the DC bias voltage.

22 Claims, 9 Drawing Sheets

OTHER PUBLICATIONS

Demirci et al.; "Mechanically Corner-Coupled Square Microresonator Array for Reduced Series Motional Resistance"; Journal of Microelectromechanical Systems, vol. 15, No. 6, Dec. 2006, pp. 1419-1436.*

L. F. Cheow, H. Chandrahalim, and S. A. Bhave, "MEMS filter with voltage-tunable center frequency and bandwidth," Hilton Head 2006, Hilton Head Island, SC, Jun. 4-8, 2006, pp. 304-307.

B. Kim. M. Hopcroft, C. M. Jha, R. Melamud, S. Chandorkar, M. Agarwal, K. L. Chen, W. T. Park, R. Candler, G. Yama, A. Partridge, M. Lutz, T. W. Kenny, "Using MEMS to build the device and package," Transducers '07, Lyon, France, Jun. 10-14, 2007, pp. 331-334.

D. Weinstein, H. Chandrahalim, L. F. Cheow, and S. A. Bhave, "Dielectrically transduced single-ended to differential MEMS filter," ISSCC 2006, San Francisco, California, Feb. 4-8, 2006, pp. 318-319.

S. Pourkamali, and F. Ayazi, "High frequency low impedance capacitive silicon bar structures," Hilton Head 2006, Hilton Head Island, SC, Jun. 4-8, 2006, pp. 284-287.

H. Chandrahalim, S. A. Bhave, E. Quevy, and R. T. Howe, "Aqueous transduction of poly-SiGe disk resonators," Transducers'07, Lyon, France, Jun. 10-14, 2007, pp. 313-316.

S.-S. Li, Y.-W. Lin, Z. Ren, and C. T.-C. Nguyen, "A micromechanical parallel-class disk-array filter," Frequency Control Symposium 2007, Geneva, Switzerland, May 29-Jun. 1, 2007, pp. 1356-1361.

V. Kaajakari, T. Mattila, J. Kiihamaki, H. Kattelus, A.Oja, and H. Seppä, "Nonlinearities in single-crystal silicon micromechanical resonators," Transducers '03, Boston, MA, Jun. 9-12, 2003, pp. 1574-1577.

L. Khine, M. Palaniapan, and W.-K. Wong, "6MHz bulk-mode resonator with Q values exceeding one million," Transducers '07, Lyon, France, Jun. 10-14, 2007, pp. 2445-2448.

S. A. Bhave, and R.T. Howe, "Silicon nitride-on-silicon bar resonator using internal electrostatic transduction," Transducers'05, Seoul, Korea, Jun. 5-9, 2005, pp. 2139-2142.

M.-H. Cho, G.-W. Huang, C.-S. Chiu, K.-M. Chen, A.-S. Peng, and Y.-M. Teng, "A cascade open-Short-thru (COST) de-embedding method for microwave on-wafer characterization and automatic measurements," IEICE Transactions on Electronics E88-C(5), pp. 845-850, 2005.

P. Stephanou, "Piezoelectric Aluminum Nitride MEMS Resonators for RF Signal Processing," Ph.D. Thesis, University of California, Berkley, Dec. 2006, pp. 119-122.

S.-S. Li, "Medium-scale integrated micromechanical filters for wireless communications," Ph.D. Thesis, University of Michigan, Ann Arbor, May 2007, pp. 180-182.

* cited by examiner

DIGITALLY PROGRAMMABLE RF MEMS FILTERS WITH MECHANICALLY COUPLED RESONATORS

CROSS-REFERENCE TO RELATED APPLICATION

This application claims the benefit of priority from U.S. Provisional Patent Application Ser. No. 61/109,341, filed Oct. 29, 2008, the disclosure of which is incorporated herein by reference.

FIELD

The claimed invention relates to micro-electromechanical systems (MEMS) filters, and more particularly to programmable MEMS filters with mechanically coupled resonators.

BACKGROUND

Numbers enclosed in brackets throughout the specification refer to correspondingly numbered items in the List of References at the end of the specification. The disclosures of these items are incorporated herein by reference.

Multi-band, multi-standard radio receivers such as next generation 7-band cellular phones and the joint task force radio system (JTRS) require a large array of channel-select filters connected in parallel. The input capacitance of the filter array will 'load' individual filters, deteriorating their stopband rejection. Therefore, such frequency agile radios need multi-octave tunable band-select radio frequency (RF) filters and bandwidth tunable channel-select intermediate frequency (IF) filters with good shape factor and excellent stopband rejection. An IF filter with dynamically tunable bandwidth will enable handling of multiple waveforms, eliminate out-of-channel interferers, and substantially decrease the number of filters in next-generation receivers.

Dielectrically-transduced thickness shear-mode resonators with analog voltage tunable center frequency and bandwidth are suitable candidates for channel-select IF filters [1]. The resonators require a back-side etch of the SOI substrate to pattern orthogonal frequency tuning electrodes and eliminate parasitic pad capacitance and resistive ground loops. However, such back-side processing is not compatible with the high-vacuum, ultra-clean epi-silicon encapsulation technology [2] necessary for field deployment of these filters. Contour-mode MEMS resonators with Q>5,000, low $R_X$, compatibility with epi-silicon encapsulation and CAD-defined resonance frequencies from 10 MHz-1 GHz are excellent candidates for designing channel-select filter arrays [3].

Unlike thickness shear mode resonators, however, the frequency expressions for contour modes and flexural vibration modes do not directly couple. It is therefore difficult to perform orthogonal frequency tuning of contour-mode resonators. However extensional mode resonators cannot be tuned at device-level without excessive heating [4] or using liquid dielectric [5]. Therefore, it would be desirable to have a practical, easily manufacturable, and digitally programmable RF MEMS filter that overcomes such existing limitations.

SUMMARY OF THE INVENTION

The present invention is directed to a tunable filter using a novel DC-biasing strategy in a mechanically coupled resonator array that does not require any frequency off-set between constituent resonators. As a result, lithography challenges are minimized, spatial distortion is greatly reduced, and spurs in filter transmission are attenuated [6].

A digitally-tunable RF MEMS filter comprises a plurality of mechanically coupled identical resonators, wherein a first and a last resonator of the plurality of mechanically coupled resonators are configured to be electrostatically transduced in order to vibrate.

In a method of digitally tuning an RF MEMS filter having a mechanically coupled resonator array, all resonators in the array being identical. The method comprises applying a DC bias voltage at least a first resonator and a last resonator of the mechanically coupled resonator array such that motional boundary conditions for the at least first resonator and last resonator are selectable in proportion to the DC bias voltage.

Another digitally-tunable RF MEMS filter comprises a plurality of mechanically coupled identical 2D square extensional mode resonators having checkered electrodes for transduction. The plurality of resonators includes a first resonator, a second resonator, a third resonator, and a last resonator. At least the first and the last resonator of the plurality of the mechanically coupled resonators are configured to be electrostatically transduced in order to vibrate. The plurality of mechanically coupled resonators are coupled by quarter wavelength suspensions at low velocity nodes. One or more of the plurality of mechanically coupled resonators are configured to be biased relative to each other.

DETAILED DESCRIPTION

MEMS resonators vibrating in a bulk-mode have superior linearity and high quality factors [7,8]. The bulk-extensional mode resonance of a square resonator depends on length L, with frequency $f=(n/2L)\sqrt{E/\rho}$, where E and $\rho$ are effective elastic modulus for 2D expansion and density of the resonator, respectively, and n is the harmonic order.

Figure 1:
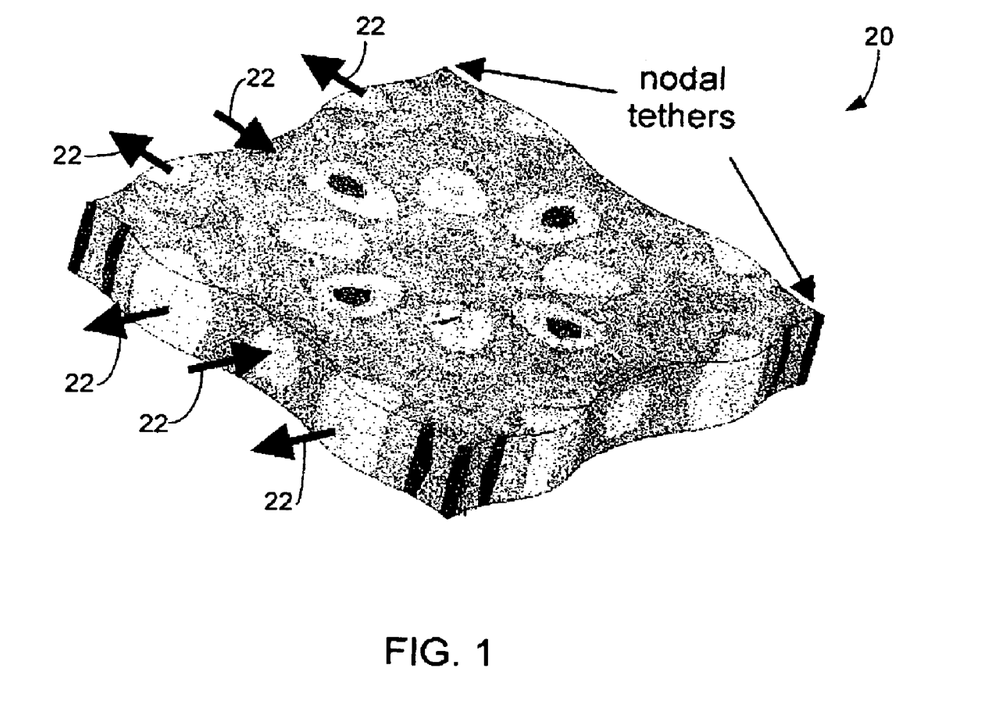
FIG. 1 depicts the ANSYS mode shape of a 3×3 overtone square-extensional resonator.

FIG. 1 depicts the ANSYS mode shape of a 3×3 overtone square-extensional resonator 20. The arrows 22 indicate alternate square sections expanding and contracting. In this embodiment, higher frequency overtone modes are selectively excited by patterning electrodes (not shown in this illustration) in checkerboard configuration on top of the resonator using dielectric transduction.

Figure 2A:
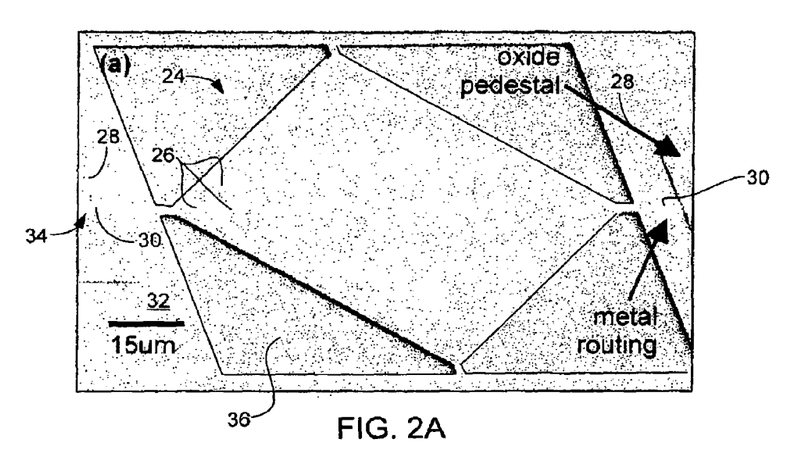
FIG. 2A is a scanning electron micrograph (SEM) of an embodiment of an overtone 2D square-extensional mode resonator with checkered electrodes for transduction.

FIG. 2A is a scanning electron micrograph (SEM) of an embodiment of an overtone 2D square-extensional mode resonator 24 with checkered electrodes 26 for transduction. In this embodiment, the 511 MHz resonator, which was fabricated in a silicon nitride-on-silicon process [9], comprises a 100 nm thick SiN transducer layer sandwiched between 100 nm thick poly top electrodes and a 3.1 μm thick silicon device layer. An oxide pedestal layer 28 is added to the silicon nitride-on-silicon process to elevate the RF signal lines 30 off the ground plane 32. In this embodiment, platinum metal traces and pads were introduced to improve RF signal integrity and reduce noise during probing. Other embodiments may use other materials for the conductive traces.

As one example, a 50V DC+small AC voltage is applied to the drive electrode 34, and the silicon device layer 36 is connected to RF ground. This time-varying voltage causes a squeezing force on the dielectric thin film in the resonator 24. The dielectric layer experiences a lateral strain resulting from the Poisson effect. As the strain distributes through the resonator, the overtone square-extensional mode is excited.

Such resonators may be characterized in a RF probe station in a 2-port configuration using ground-signal-ground (GSG) probes. Parasitics up to the probe tips may be first canceled with short-open-load-thru (SOLT) measurements on a standard calibration substrate. De-embedding may then be performed with Cascade WinCal software, using short, open, and through structures fabricated on-chip, but separate from the filters [10]. This de-embedding allows for the cancellation of the large pad capacitance without canceling out any parasitics inherent to the filters themselves, including suspension beam routing and transduction electrodes on the resonators.

Figure 2B:
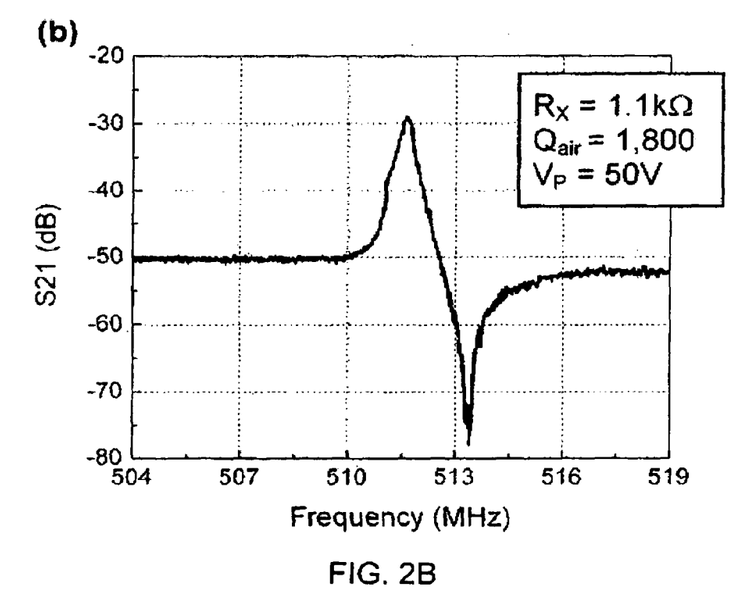
FIG. 2B is a plot of the measured series resonance transmission response of the resonator of FIG. 2A in air.

FIG. 2B depicts the measured series resonance transmission response of the resonator from FIG. 2A, the transmission response having a motional impedance $R_X$ of 1.1 kΩ and Q of 1800 in air.

Embodiments of multi-pole mechanically-coupled filters may be realized by coupling multiple resonators using quarter-wavelength suspensions ($k_s$) at low-velocity nodes. The quarter-wavelength springs minimize mass-loading of the resonators, and low-velocity coupling enables narrow-bandwidth filter design with standard lithography tools. At radio frequencies, however, the effective stiffness ($k_r$) and mass ($m_r$) of overtone mode resonators have the advantage of scaling with the overtone order, minimizing filter distortion due to mass-loading and simplifying narrow-bandwidth filter design with coupled resonators at maximum-velocity locations.

Figure 3:
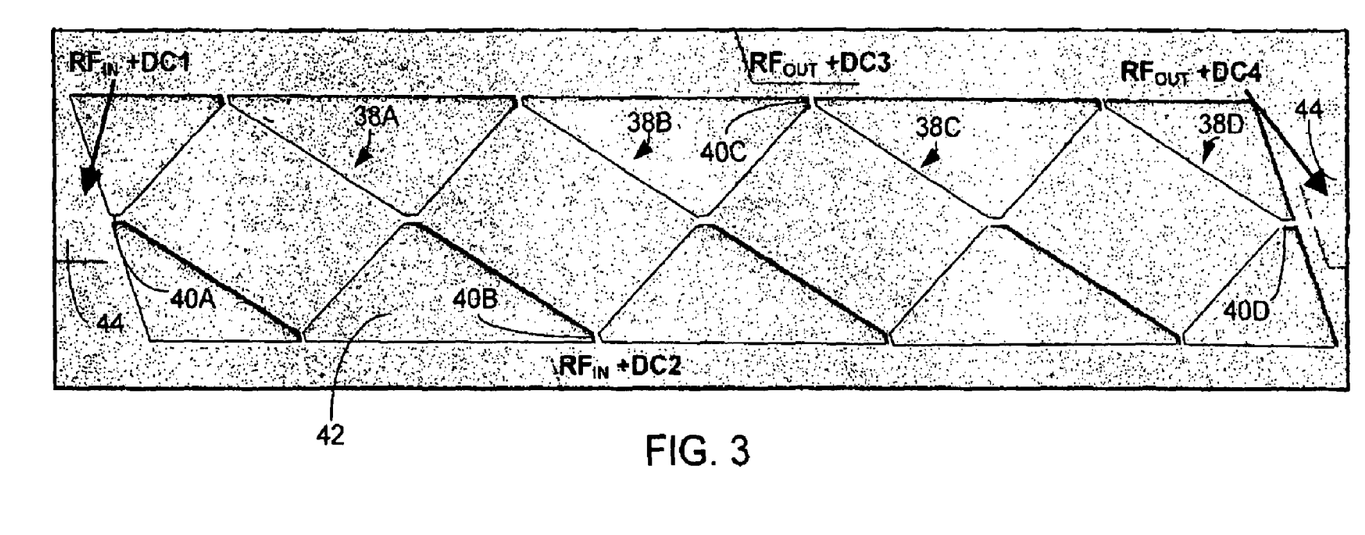
FIG. 3 depicts an embodiment of a mechanically coupled four-pole programmable filter having overtone square-extensional resonators.
Figure 4A:
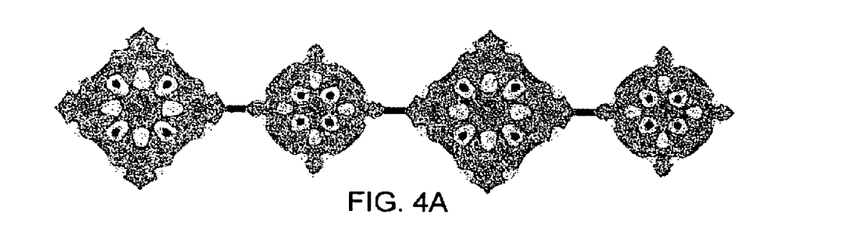
FIGS. 4A-4D schematically depict the four vibration modes of the four-pole filter depicted in FIG. 3.
Figure 4B:
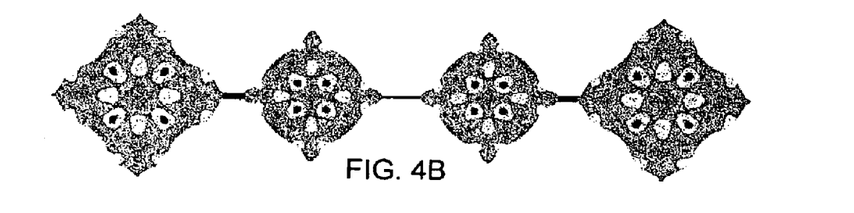
Figure 4C:
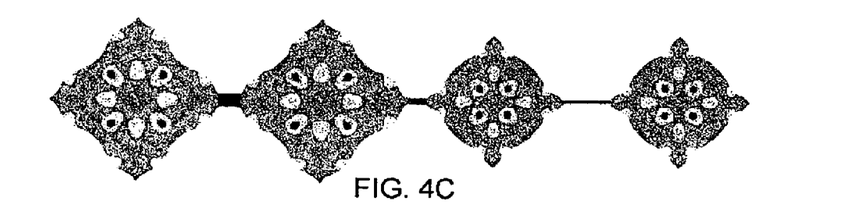
Figure 4D:
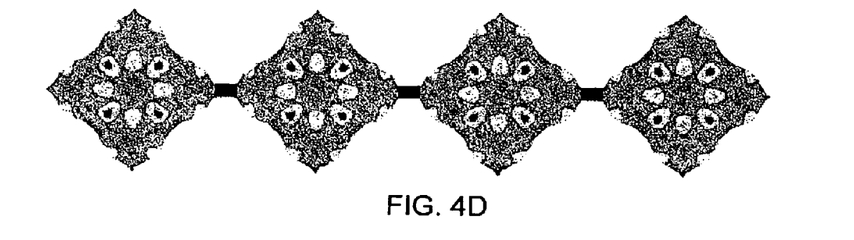

FIG. 3 depicts an embodiment of a series of four mechanically coupled overtone square-extensional resonators 38A, 38B, 38C, and 38D. In this embodiment, each resonator has individually addressable RF+DC lines 40A, 40B, 40C, and 40D, respectively. The silicon device layer 42 is an RF ground to prevent substrate losses. All RF paths are metallized, routed on an elevated oxide bridge 44 to reduce capacitance and de-embedded to the edge of DRIE trench.

FIGS. 4A-4D illustrate the four vibration modes [11] of the filter depicted in FIG. 3:

$$f_1 = \sqrt{k_r/m_r} \text{ (corresponding to FIG. 4A)}$$

$$f_2 = \sqrt{(k_r+k_s)/m_r} \text{ (corresponding to FIG. 4B)}$$

$$f_3 = \sqrt{(k_r+2k_s)/m_r} \text{ (corresponding to FIG. 4C)}$$

$$f_4 = \sqrt{(k_r+3k_s)/m_r} \text{ (corresponding to FIG. 4D)}$$

Only the first and last resonators of multi-pole mechanically-coupled filters need to be electrostatically transduced. The intermediate resonators are mechanically coupled, and DC biasing is not an absolute requirement. Individual control of the DC bias ($V_P$) is maintained for each resonator, and this property can be exploited to implement digitally-tunable bandwidth channel-select filters. The programmable filter embodied in FIG. 3 may be configured as follows:

1. [DC1=+$V_P$, DC2=DC3=OFF, DC4=+$V_P$]—excites all 4 vibration modes and enables 4-port filter response.
2. [DC1=DC3=+$V_P$, DC2=DC4=-$V_P$]—excites the first two resonators out-of-phase. The system still four vibration modes; however the DC bias configuration attenuates the excitation of modes #3 and #4. In addition, the DC bias configuration of the last two resonators sums the out-of-phase motion of the resonators while nulling in-phase modes (and motional currents). The configuration results in a 2-pole lower sub-band filter.
3. [DC1=DC2=DC3=DC4=+$V_P$]—excites the first two resonators in-phase. This leads to exact inverse of the above configuration and results in a 2-pole higher sub-band filter.

To retain individual control of each transducer and reduce RF losses to the substrate, the silicon device layer is maintained at an RF ground, and each RF I/O port has a superimposed independent DC supply. Calibration and de-embedding procedures to eliminate excessive probe-pad and substrate parasitics is performed prior to RF measurements [10]. The power-splitters and bias-Ts (DC=GND) for $RF_{IN}$ and $RF_{OUT}$ were included during de-embedding. As one example, the programmable filter may be configured and characterized as follows:

1. [DC1=50V, DC2=DC3=0V, DC4=50V]—enables a 4-pole filter with 1.4 MHz bandwidth at 508.7 MHz center frequency.
2. [DC1=DC3=40V, DC2=DC4=-40V]—preferentially excites and senses the first two vibration has modes which results in a 720 kHz bandwidth lower sub-band filter.
3. [DC1=DC2=DC3=DC4=40V]—preferentially excites and senses the last two vibration modes which results in a 660 kHz bandwidth higher sub-band filter.

Figure 5:
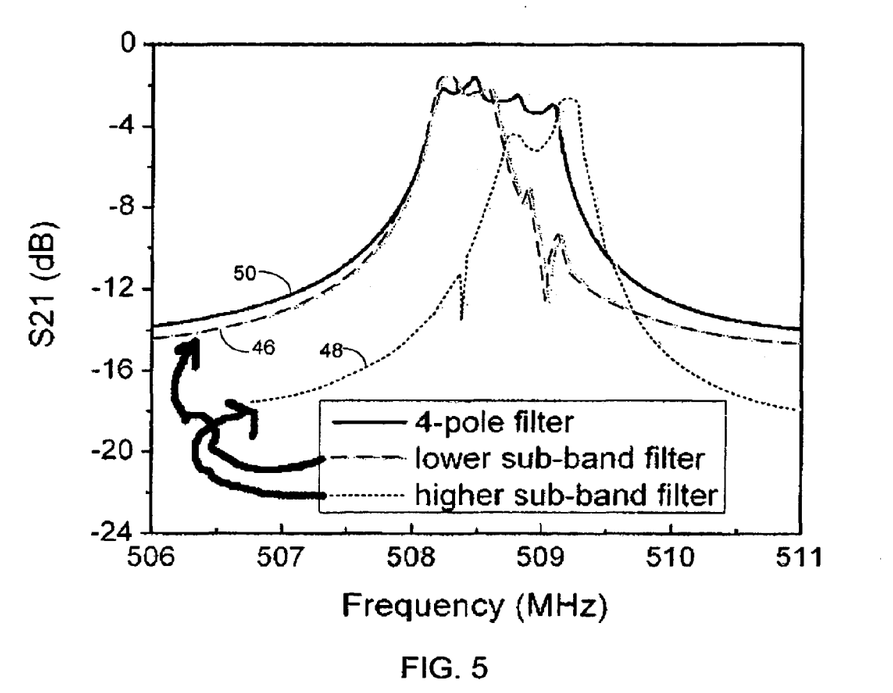
FIG. 5 depicts the terminated response for three configurations of the programmable filter depicted in FIG. 3.

FIG. 5 depicts the transmission response of three filters after termination using the PNA Network Analyzer's pole-Z conversion function. The attenuated modes are clearly visible in the transmission response of the lower sub-band filter 46. Results for the higher sub-band filter 48 as well as the 4-pole filter 50 are also shown. The filter stop-band floor is high because electrical resistance in the ground plane leads to large capacitive feedthrough between drive and sense ports.

TABLE 1 is a summary of the terminated filter response of each embodied configuration. The DC bias for the sub-band filters was reduced to 40V to compensate for increased transducer area and ensure all filters have the same impedance for characterization.

TABLE 1

Summary of filter performance

|  | 4-pole filter | Lower sub-band filter | Higher sub-band filter |
| --- | --- | --- | --- |
| Insertion Loss | −2.4 dB | −2 dB | −3.1 dB |
| 3 dB Bandwidth | 1.4 MHz | 720 kHz | 660 kHz |
| $f_{CENTER}$ | 508.7 MHz | 508.3 MHz. | 509.1 MHz |

TABLE 1-continued

Summary of filter performance

|  | 4-pole filter | Lower sub-band filter | Higher sub-band filter |
|---|---|---|---|
| Ripple | <2 dB | <1 dB | <3 dB |
| stop band rejection | −14 dB | −14 dB | −20 dB |
| DC Bias | 50 V on first and last resonators | 40 V and −40 V on alternate resonators. | 40 V on all resonators |
| $R_{TERMINATION}$ | 4.1 kΩ | 2.8 kΩ | 2.9 kΩ |

A digitally-tunable RF MEMS filter is produced by controlling the DC bias voltages of individual resonators in a series coupled array. For example, some embodiments may use tri-state polarization voltage control ($-V_P$, GND, $+V_P$) to enable the programmable filter to provide bandwidth granularity for next generation frequency-agile radios. Although other embodiments may use square-extensional and other contour-mode MEMS resonators as candidates for designing channel-select filter arrays, they are not preferred since they are difficult to tune significantly at the device level. By use of the system-level digital-tuning technique, a 4-pole filter consisting of four overtone square-extensional mode resonators at 509 MHz with 1.4 MHz bandwidth can be produced. Switching the DC polarization voltage of the individual resonators results in splitting of the filter into narrower high and low sub-bands, each approximately 700 kHz wide in this embodiment.

The SOI fabrication process and resistive losses through the device layer enables an array of four resonators to be produced, with each RF I/O port having a superimposed independent DC supply. However larger arrays can be produced using other processes, such as, but not limited to a surface-micromachining process [12]. Although the maximum possible bandwidth is limited by the coupling efficiency of the transducer, the inclusion of more resonators in the array would provide finer bandwidth granularity.

As previously noted, multi-band radio receivers require a large array of channel-select filters connected in parallel. A filter with digitally tunable center frequency and bandwidth may overcome fabrication tolerances and thermal drift. In addition, it may also reduce capacitive loading at the filter input, enable handling of multiple waveforms, and substantially decrease the number of filters in next-generation receivers. Unlike electrically coupled ladder filters, in multipole-pole mechanically-coupled filters only the first and last resonators of the filter array are electrostatically transduced. The intermediate resonators in the array are all mechanically coupled and do not require DC biasing.

Figure 6:
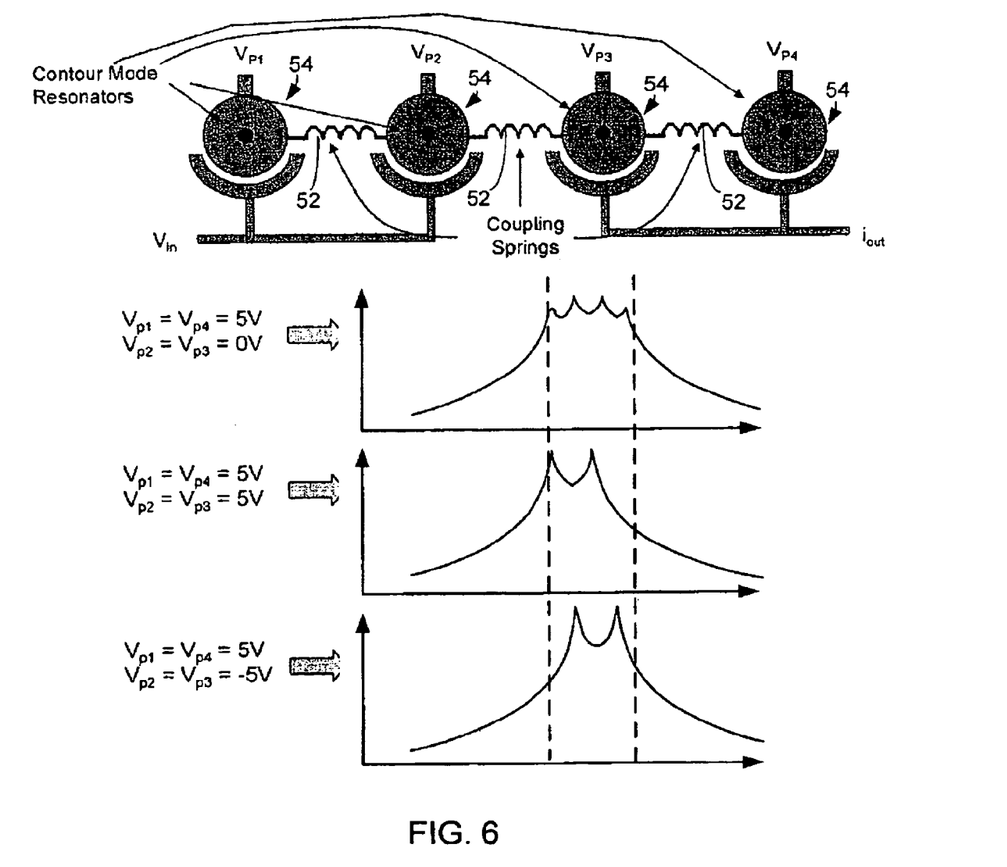
FIG. 6 schematically depicts another embodiment of a filter comprising four mechanically coupled contour mode disk resonators.

FIG. 6 schematically depicts an embodiment of a mechanically coupled four-resonator array filter in accordance with the claimed invention. The springs 52 between resonators 54 provide mechanical coupling such that all resonators are electrically decoupled. Hence, each resonator can be DC-biased separately. Consider the following three DC-bias configurations:

1. $V_{p1}=V_{p4}=5V$, $V_{p2}=V_{p3}=0$ Volts: Generates a 4-pole channel-select band-pass filter.
2. $V_{p1}=V_{p2}=V_{p3}=V_{p4}=5$ Volts: Generates a 2-pole narrower bandwidth filter.
3. $V_{p1}=V_{p4}=5V$, $V_{p2}=V_{p3}=-5$ Volts: Generates a 2-pole filter with similar bandwidth as #2, but with a different center frequency.

By application of 5V, 0V or −5V, the filter center frequency and bandwidth and bandwidth can be changed. This technique scales to longer resonator chains and 2D resonator arrays. It is especially attractive for electrostatic (air-gap or high-K dielectric) bulk acoustic mode The lateral anchoring scheme of each constituent resonator that form the channel-select filter gives the flexibility to apply bias voltage from the underneath silicon substrate that exerts electrostatic pull-in force. The electrostatic pull-in force will bring the laterally suspended resonators down to make contact with silicon substrate.

Figure 7:
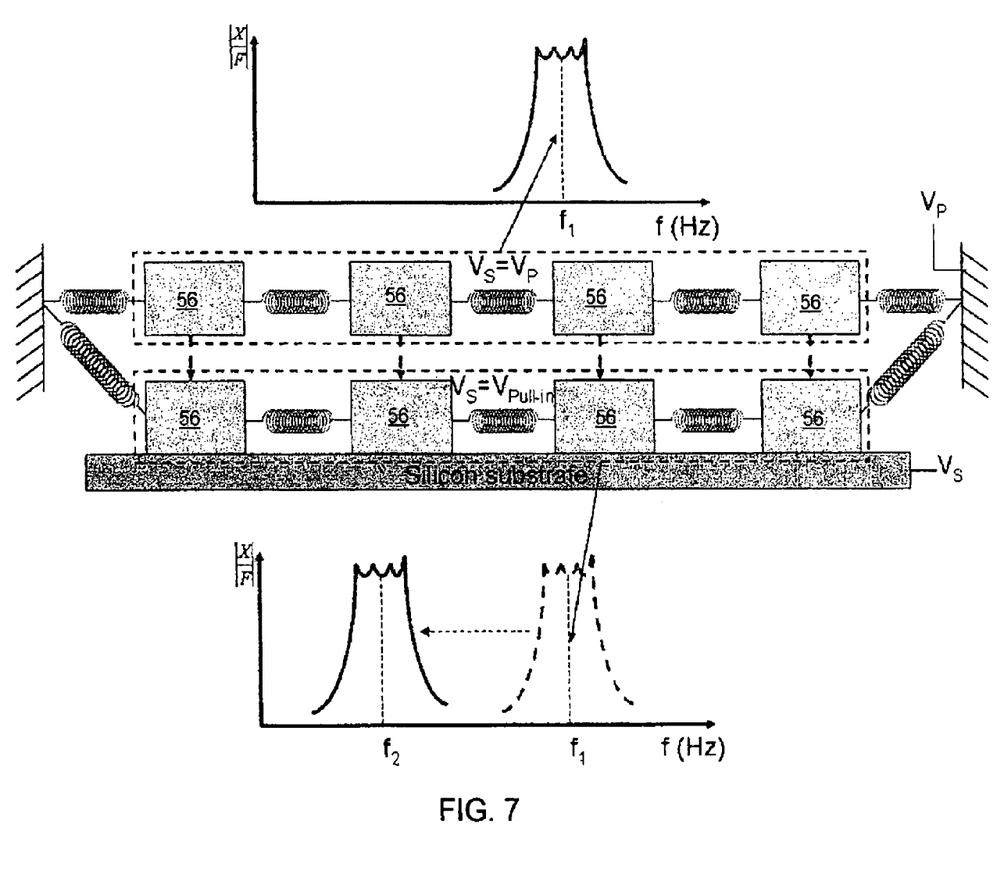
FIG. 7 illustrates an embodiment of frequency hopping resulting from alteration of the mode of vibration of each constituent resonator of the filter.

FIG. 7 illustrates an embodiment of frequency hopping that results by alteration of the mode of vibration of each constituent resonator 56 in real time. The silicon substrate 58 can optionally be coated with a non-conducting layer to prevent shorting and current flow between the resonator and the substrate. Depending upon the type of each constituent resonator 56, the center frequency of the pulled-down network can be higher or lower than the initial center frequency before the system experiences the non-linear electrostatic pull-in force.

In the resonators 56 shown in FIG. 7, for example, the bottom faces of the resonators are fixed to an effectively infinite silicon substrate, imposing zero-displacement boundary conditions at the base of the resonators. Hence, the constituent resonators of the channel-select filter will naturally alter the originally excited lateral mode of vibration to the thickness shear mode of vibration that gives different center frequency. The channel-select RF MEMS filter with digitally programmable bandwidth and center frequency posses the potential capability to cover the quad-band standard of GSM radio spectrum frequencies. This technique also scales to longer resonator chains and 2D resonator arrays.

Figure 8:
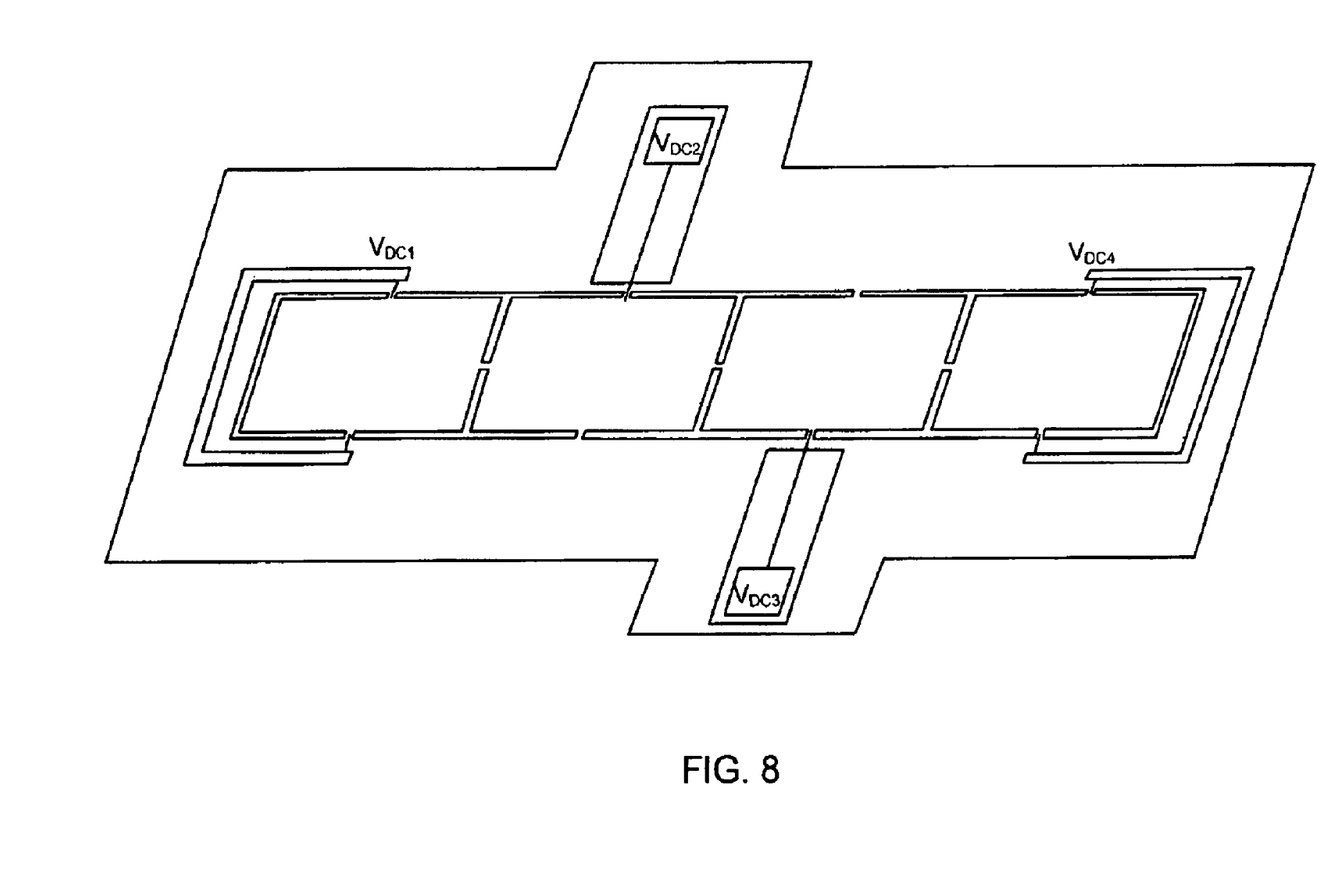
FIG. 8 shows an SEM image of a fabricated embodiment of an RF MEMS filter with digitally programmable bandwidth and center frequency.

FIG. 8 shows an SEM image of another embodiment of a fabricated RF MEMS filter with digitally programmable bandwidth and center frequency.

Figure 9A:
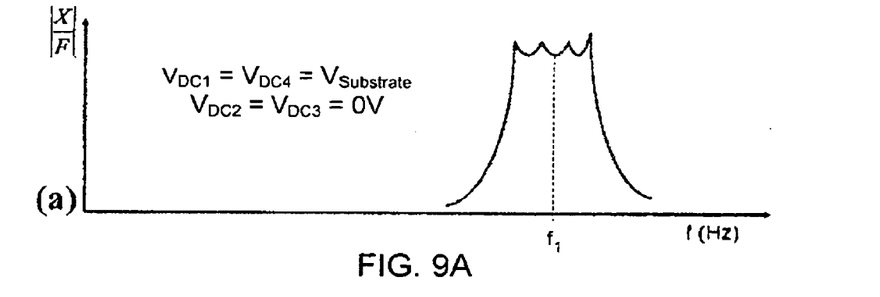
FIG. 9A-9C illustrate examples of filter shapes for unterminated MEMS resonators.
Figure 9B:
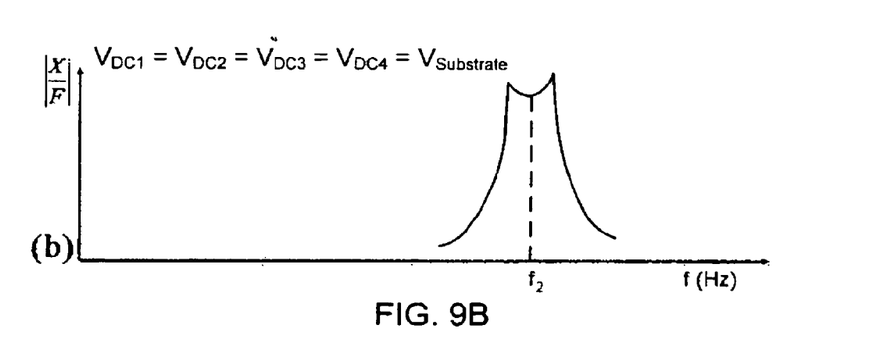
Figure 9C:
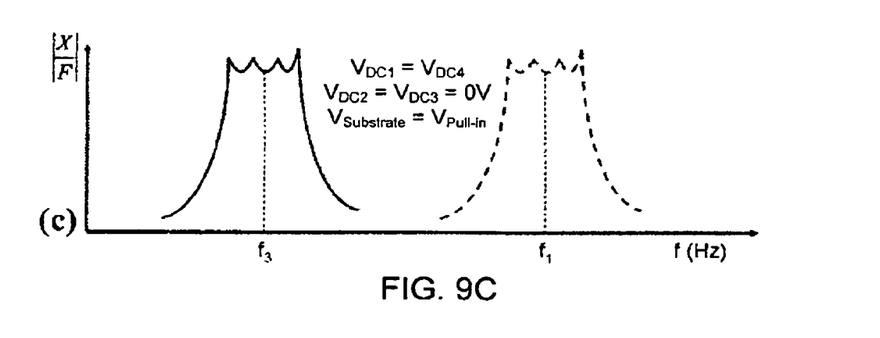

FIGS. 9A-9C shows examples of filter shapes for unterminated MEMS resonators in accordance with the claimed invention. Application of $V_{DC1}$, $V_{DC4}$ and $V_{Substrate}$ with equal bias voltage and no bias voltage to the intermediate resonators will cause the channel select-filter to give a typical bandpass response, as illustrated in FIG. 9A. Application of equal bias voltage to all four constituent resonators and the underneath silicon substrate will result a typical bandpass response, as illustrated in FIG. 9B. Center frequency hopping as a result of changing in mode of vibration will occur when an equal bias voltage is applied to $V_{DC1}$, $V_{DC4}$, zero bias voltage is applied to the intermediate resonators, and pull in voltage is applied to the silicon substrate. A typical filter response for this case is illustrated in FIG. 9C.

Although preferred embodiments of the invention are described herein in detail, it is understood by those skilled in the art that variations may be made thereto without departing from the spirit of the invention or from the scope of the appended claims.

LIST OF REFERENCES

[1] L. F. Cheow, H. Chandrahalim, and S. A. Bhave, "MEMS filter with voltage-tunable center frequency and bandwidth," *Hilton Head* 2006, Hilton Head Island, S.C., Jun. 4-8, 2006, pp. 304-307.

[2] B. Kim, M. Hoperoft, C. M. Jha, R. Melamud, S. Chandorkar, M. Agarwal, K. L. Chen, W. T. Park, R. Candler, G. Yama, A. Partridge, M. Lutz, T. W. Kenny, "Using MEMS to build the device and the package," *Transducers* '07, Lyon, France, Jun. 10-14, 2007, pp. 331-334.

[3] D. Weinstein, H. Chandrahalim, L. F. Cheow, and S. A. Bhave, "Dielectrically transduced single-ended to differential MEMS filter," *ISSCC* 2006, San Francisco, Calif., Feb. 4-8, 2006, pp. 318-319.

[4] S. Pourkamali, and F. Ayazi, "High frequency low impedance capacitive silicon bar structures," *Hilton Head* 2006, Hilton Head Island, S.C., Jun. 4-8, 2006, pp. 284-287.

[5] H. Chandrahalim, S. A. Bhave, E. Quevy, and R. T. Howe, "Aqueous transduction of poly-SiGe disk resonators," *Transducers* '07, Lyon, France, Jun. 10-14, 2007, pp. 313-316.

[6] S.-S. Li, Y.-W. Lin, Z. Ren, and C. T.-C. Nguyen, "A micromechanical parallel-class disk-array filter," *Frequency Control Symposium* 2007, Geneva, Switzerland, May 29-Jun. 1, 2007, pp. 1356-1361.

[7] V. Kaajakari, T. Mattila, J. Kiihamäki, H. Kattelus, A. Oja, and H. Seppä, "Nonlinearities in single-crystal silicon micromechanical resonators," *Transducers* '03, Boston, Mass., Jun. 9-12, 2003, pp. 1574-1577.

[8] L. Khine, M. Palaniapan, and W.-K. Wong, "6 MHz bulk-mode resonator with Q values exceeding one million," *Transducers* '07, Lyon, France, Jun. 10-14, 2007, pp. 2445-2448.

[9] S. A. Bhave, and R. T. Howe, "Silicon nitride-on-silicon bar resonator using internal electrostatic transduction," *Transducers* '05, Seoul, Korea, Jun. 5-9, 2005, pp. 2139-2142.

[10] M.-H. Cho, G.-W. Huang, C.-S. Chiu, K.-M. Chen, A.-S. Peng, and Y.-M. Teng, "A cascade open-short-thru (COST) de-embedding method for microwave on-wafer characterization and automatic measurement," *IEICE Transactions on Electronics* E88-C(5), pp. 845-850, 2005.

[11] P. Stephanou, "Piezoelectric Aluminum Nitride MEMS Resonators for RF Signal Processing," *Ph.D. Thesis*, University of California, Berkeley, December 2006, pp. 119-122.

[12] S.-S. Li, "Medium-scale integrated micromechanical filters for wireless communications," *Ph.D. Thesis*, University of Michigan, Ann Arbor, May 2007, pp. 180-182.

What is claimed:

1. A digitally-tunable RF MEMS filter comprising:
a plurality of mechanically coupled identical resonators wherein:
at least a first and a last resonator of the plurality of mechanically coupled resonators are configured to be electrostatically transduced in order to vibrate.

2. The RF MEMS filter of claim 1, wherein each of the one or more of the plurality of mechanically coupled identical resonators comprises one or more electrodes configured to receive a DC bias voltage relative to adjacent resonators.

3. The RF MEMS filter of claim 1, further comprising:
first and second RF input ports coupled to the first resonator; and
first and second RF output ports coupled to the last resonator.

4. The RF MEMS filter of claim 1, further comprising:
a first RF input port coupled to the first resonator;
a second RF input port coupled to a second resonator of the plurality of mechanically coupled identical resonators;
a first RF output port coupled to a third resonator of the plurality of mechanically coupled identical resonators; and
a second RF output port coupled to the last resonator.

5. The RF MEMS filter of claim 1, wherein at least one of the plurality of mechanically coupled identical resonators comprises a 2D square extensional mode resonator.

6. The RF MEMS filter of claim 5, wherein the 2D square extensional mode resonator further comprises checkered electrodes for transduction.

7. The RF MEMS filter of claim 1, wherein each of the plurality of mechanically coupled identical resonators comprises:
one or more conducting top electrodes;
a compressible film layer; and
a device layer.

8. The RF MEMS filter of claim 7, wherein the one or more conducting top electrodes for each of the plurality of mechanically coupled identical resonators are configured to be coupled to an independent DC bias superimposed with either an RF input or an RF output.

9. The RF MEMS filter of claim 1, further comprising at least one intermediate resonator of the plurality of mechanically coupled identical resonators that is coupled between the first and last resonator, wherein the at least first and last resonator are configured to receive a DC bias, and wherein the at least one intermediate resonator is not configured to receive a DC bias.

10. The RF MEMS filter of claim 1, wherein the plurality of mechanically coupled identical resonators are coupled by quarter wavelength suspensions at low velocity nodes.

11. A method of digitally tuning an RF MEMS filter having a mechanically coupled resonator array, wherein all resonators in the array are identical, the method comprising:
applying a DC bias voltage to at least a first resonator and a last resonator of the mechanically coupled resonator array such that motional boundary conditions for the at least first resonator and last resonator are selectable in proportion to the DC bias voltage.

12. The method of claim 11, wherein:
the mechanically coupled resonator array comprises the first resonator, a second resonator, a third resonator, and the last resonator; and
applying the DC bias voltage comprises applying one of three states in a tri-state voltage control to each of the resonators in the resonator array.

13. The method of claim 12, wherein the three states of the tri-state voltage control comprise:
a positive bias voltage;
an off bias voltage; and
a negative bias voltage.

14. The method of claim 13, wherein a four-pole filter response is enabled by:
applying the positive bias voltage to the first resonator;
applying the off bias voltage to the second resonator;
applying the off bias voltage to the third resonator; and
applying the positive bias voltage to the last resonator.

15. The method of claim 13, wherein a two-pole lower sub-band filter is enabled by:
applying the positive bias voltage to the first resonator;
applying the negative bias voltage to the second resonator;
applying the positive bias voltage to the third resonator; and
applying the negative bias voltage to the last resonator.

16. The method of claim 13, wherein a two-pole higher sub-band filter is enabled by:
applying the positive bias voltage to the first resonator;
applying the positive bias voltage to the second resonator;
applying the positive bias voltage to the third resonator; and
applying the positive bias voltage to the last resonator.

17. A digitally-tunable RF MEMS filter comprising:
a plurality of mechanically coupled identical 2D square extensional mode resonators having checkered electrodes for transduction comprising:
   a first resonator;
   a second resonator;
   a third resonator; and
   a last resonator; and
wherein:
   at least the first and the last resonator of the plurality of mechanically coupled resonators are configured to be electrostatically transduced in order to vibrate; and
   the plurality of mechanically coupled resonators are coupled by quarter wavelength suspensions at low velocity nodes; and
   one or more of the plurality of mechanically coupled resonators are configured to be biased relative to adjacent resonators.

18. A method of digitally tuning an RF MEMS filter having a mechanically coupled resonator array, the method comprising:
   applying a DC bias voltage to at least a first resonator and a last resonator of the mechanically coupled resonator array such that motional boundary conditions for the at least first resonator and last resonator are selectable in proportion to the DC bias voltage;
   wherein the mechanically coupled resonator array comprises the first resonator, a second resonator, a third resonator, and the last resonator; and
   applying the DC bias voltage comprises applying one of three states in a tri-state voltage control to each of the resonators in the resonator array.

19. The method of claim 18, wherein the three states of the tri-state voltage control comprise:
   a positive bias voltage;
   an off bias voltage; and
   a negative bias voltage.

20. The method of claim 19, wherein a four-pole filter response is enabled by:
   applying the positive bias voltage to the first resonator;
   applying the off bias voltage to the second resonator;
   applying the off bias voltage to the third resonator; and
   applying the positive bias voltage to the last resonator.

21. The method of claim 19, wherein a two-pole lower sub-band filter is enabled by:
   applying the positive bias voltage to the first resonator;
   applying the negative bias voltage to the second resonator;
   applying the positive bias voltage to the third resonator; and
   applying the negative bias voltage to the last resonator.

22. The method of claim 19, wherein a two-pole higher sub-band filter is enabled by:
   applying the positive bias voltage to the first resonator;
   applying the positive bias voltage to the second resonator;
   applying the positive bias voltage to the third resonator; and
   applying the positive bias voltage to the last resonator.

* * * * *

UNITED STATES PATENT AND TRADEMARK OFFICE
CERTIFICATE OF CORRECTION

PATENT NO. : 8,390,398 B2
APPLICATION NO. : 12/608290
DATED : March 5, 2013
INVENTOR(S) : Chandrahalim et al.

It is certified that error appears in the above-identified patent and that said Letters Patent is hereby corrected as shown below:

On the Title Page

In the Assignee (73): Delete "Cornell Center for Technology, Enterprise and Commercialization" and insert --Cornell University--

Signed and Sealed this
Fourteenth Day of May, 2013

Teresa Stanek Rea
*Acting Director of the United States Patent and Trademark Office*